(12) United States Patent
Cronie

(10) Patent No.: US 8,952,834 B1
(45) Date of Patent: Feb. 10, 2015

(54) METHODS AND SYSTEMS FOR LOW WEIGHT CODING

(71) Applicant: Kandou Labs, S.A., Lausanne (CH)

(72) Inventor: Harm Cronie, Lausanne (CH)

(73) Assignee: Kandou Labs, S.A. (CH)

( * ) Notice: Subject to any disclaimer, the term of this patent is extended or adjusted under 35 U.S.C. 154(b) by 0 days.

(21) Appl. No.: 13/778,045

(22) Filed: Feb. 26, 2013

(51) Int. Cl.
*H03M 13/00* (2006.01)
*H03M 7/02* (2006.01)

(52) U.S. Cl.
CPC .................................... *H03M 7/02* (2013.01)
USPC .............................................. 341/94; 341/55

(58) Field of Classification Search
USPC ................... 341/94, 50, 55, 59, 155
See application file for complete search history.

(56) References Cited

U.S. PATENT DOCUMENTS

| | | | | |
|---|---|---|---|---|
| 3,938,082 A * | 2/1976 | Schowe, Jr. | .................. | 714/798 |
| 5,721,734 A * | 2/1998 | Ishida | ........................... | 370/335 |
| 7,656,337 B2 * | 2/2010 | Redmayne et al. | ........... | 341/155 |
| 8,571,416 B2 * | 10/2013 | Grobe | .......................... | 398/184 |
| 8,595,604 B2 * | 11/2013 | Hijazi et al. | .................. | 714/785 |
| 2005/0135500 A1 * | 6/2005 | Nam et al. | .................... | 375/267 |

OTHER PUBLICATIONS

Arikan, E, "Source Polarization", Information Theory Proceedings (ISIT), 2010 IEEE International Symposium on, pp. 899-903, Jun. 13-18, 2010.

Cronie, H. et al. "Lossless Source Coding with Polar Codes", Information Theory Proceedings (ISIT), 2010 IEEE International Symposium on, pp. 904-908, Jun. 13-18, 2010.

Korada, S. et al. "Polar Codes: Characterization of Exponent, Bounds, and Constructions," IEEE transactions on Information Theory, vol. 56, No. 12, Dec. 2010.

MacKay D., "Information Theory, Inference and Learning Algorithms".

* cited by examiner

*Primary Examiner* — Brian Young
(74) *Attorney, Agent, or Firm* — Invention Mine LLC

(57) ABSTRACT

Methods and circuits are described for creating low-weight codes, encoding of data as low-weight codes for communication or storage, and efficient decoding of low-weight codes to recover the original data. Low-weight code words are larger than the data values they encode, and contain a significant preponderance of a single value, such as zero bits. The resulting encoded data may be transmitted with significantly lower power and/or interference.

17 Claims, 8 Drawing Sheets

METHODS AND SYSTEMS FOR LOW WEIGHT CODING

FIELD OF THE INVENTION

The present invention relates to communications in general and in particular to the coding and transmission of signals capable of conveying information.

BACKGROUND

It is common practice for communications systems to translate information to be transmitted into a more suitable form for transmission over a communications channel. This encoding operation may be optimized in response to particular channel characteristics, such as available bandwidth, latency, noise, etc. The encoding and subsequent decoding operations may require considerable hardware resources or computational power, in particular in cases where the encoding produces longer code words.

An example of such codes are the so-called constant weight codes or low weight codes, which may briefly be described as codes in which the number of "1" bits per code word is low. These low weight codes have several applications. One of these applications is on-chip or chip-to-chip communications where the low "1" density translates into fewer signal transitions, minimizing channel crosstalk and simultaneous switching output (SSO) noise. In some bus communication schemes, power can be saved by employing constant weight or low-weight codes. Low weight codes may also have applications in volatile and non-volatile data storage.

[Arikan1] Arikan, E.;, "Source polarization," *Information Theory Proceedings (ISIT), 2010 IEEE International Symposium on*, pp.899-903, 13-18 June 2010 doi: 10.1109/ISIT.2010.5513567

[Cronie, Korada] Cronie, H. S.; Korada, S. B.;, "Lossless source coding with polar codes," *Information Theory Proceedings (ISIT), 2010 IEEE International Symposium on*, pp.904-908, 13-18 June 2010 doi: 10.1109/ISIT.2010.5513561

[Korada1] Korada, S; Sasoglu, E; Urbanke, R;, "Polar Codes: Characterization of Exponent, Bounds, and Constructions", IEEE transactions on Information Theory, VOL. 56, NO. 12, December 2010

[MacKay1] MacKay, D; "Information Theory, Inference, and Learning Algorithms"

BRIEF SUMMARY

Methods are described for transferring information, including embodiments that enable very efficient encoding and decoding of low weight codes. This information transfer comprises an encoding step in which information symbols $S=(s_1, s_2, \ldots, s_k)$, comprising k elements, are converted into code symbols $X=(x_1, x_2, \ldots, x_n)$ comprising n elements, with n>k; a transmission step for transmitting the code symbols X; and a decoding step for reconverting transmitted code symbols X into information symbols, comprising n elements, wherein in the encoding step auxiliary symbols $V=(v_1, v_1, \ldots, v_p)$, comprising p elements, are derived from information symbols S based on a predetermined encoding model and the code symbols X are derived in dependence of both the information symbols S and the auxiliary symbols V in accordance with a predetermined encoding algorithm such that the derived code symbols X are in conformity with the encoding model.

The use of a combination of information symbols and auxiliary symbols for the generation of code words enables more freedom and flexibility in the code generation, which can be used to implement an efficient code.

The term "transmission of information" as used herein should receive a broad interpretation. It covers, inter alia, real time transmitting information from a transmitter to a receiver over a transmission path, but also includes storage of information in a memory and later reading of the information from the memory.

In an embodiment, the auxiliary symbols are derived on the basis of a probabilistic computation using an encoding model determined by a predetermined constraint. This embodiment is suitable for the generation of low weight code words that have in each code word less than w bits with a predetermined logic value.

In a further embodiment, p=n-k, and the code symbols X are derived by a linear transform of intermediate symbols $U=(u_1, u_2, \ldots, u_n)$ comprising elements $s_i$ of the information symbol S and the elements $v_j$ of the auxiliary symbols V. The use of a linear transform is very advantageous since it can simply realized with combinatorial logic networks or with limited computing power.

Polarizing transforms are suitable for the creation of the code symbols out of the combinations of information symbols and auxiliary symbols.

In a further embodiment, the relation between the intermediate symbols U and the code symbols X being given by $X=T^{-1} \cdot U$ with T being the m-fold kronecker product of $$G_2^{\otimes m} = \begin{bmatrix} 1 & 1 \\ 0 & 1 \end{bmatrix}^{\otimes m}$$

where $2^m = n$.

In a further embodiment, the elements $s_j$ of the vector S correspond to the elements $u_i$ of the vector U for which the entropies $H(u_i | u_0, \ldots, u_{i-1})$ are closest to 1, the other elements $u_j$ of the vector U are equal to round $(\Pr(u_i=1 | u_0, \ldots, u_{i-1}))$. This results in an efficient and robust encoding.

Another aspect provides an encoding method wherein information symbols $S=(s_1, s_2, \ldots, s_k)$, comprising k elements, are converted into code symbols $X=(x_1, x_2, \ldots, x_n)$, with n>k wherein auxiliary symbols $V=(v_1, v_2, \ldots, v_p)$, comprising p elements, are derived from information symbols S based on a predetermined encoding model and the code symbols X are derived in dependence of both the information symbols S and the auxiliary symbols V in accordance with a predetermined encoding algorithm such that the derived code symbols X are in conformity with the encoding model.

A further aspect provides a decoding method wherein code symbols, comprising n elements, are transferred using a linear transform, in information symbols comprising k elements, with n>k.

A further aspect provides an encoder circuit for transferring information symbols, comprising k elements, into code symbols comprising n elements, wherein the encoder circuit comprises a probabilistic computation unit configured to derive an auxiliary symbol, comprising p elements, from the information symbols, a permutation unit for combining elements of the information symbols and elements of the probabilistic computation unit into an intermediate symbol, and a transform unit for transforming the intermediate symbols into the code symbols.

A further aspect provides a decoding circuit for transferring code symbols, comprising n elements, into information symbols comprising k elements, wherein the decoding circuit is configured to perform a linear transformation of the code words for the conversion of the code symbols into information symbols.

A general method and circuitry for encoding and decoding low-weight codes are provided. The encoding and decoding complexity of these codes is very low. These codes can be used in a variety of chip-to-chip communication scenarios to reduce crosstalk, to provide resilience against SSO noise and to lower power consumption. These codes may also be used in wireless communication settings such as ultra-wide band and wireless sensor networks. Another application is in volatile and non-volatile storage of information. Low-weight codes may be used to lower power consumption and increase the protection against various types of noise and non-idealities.

The application of the invention is not limited to low weight codes. The invention also enables very low complexity encoding and decoding of other categories of codes, which may have been created to reflect other design constraints.

DETAILED DESCRIPTION

Figure 1:
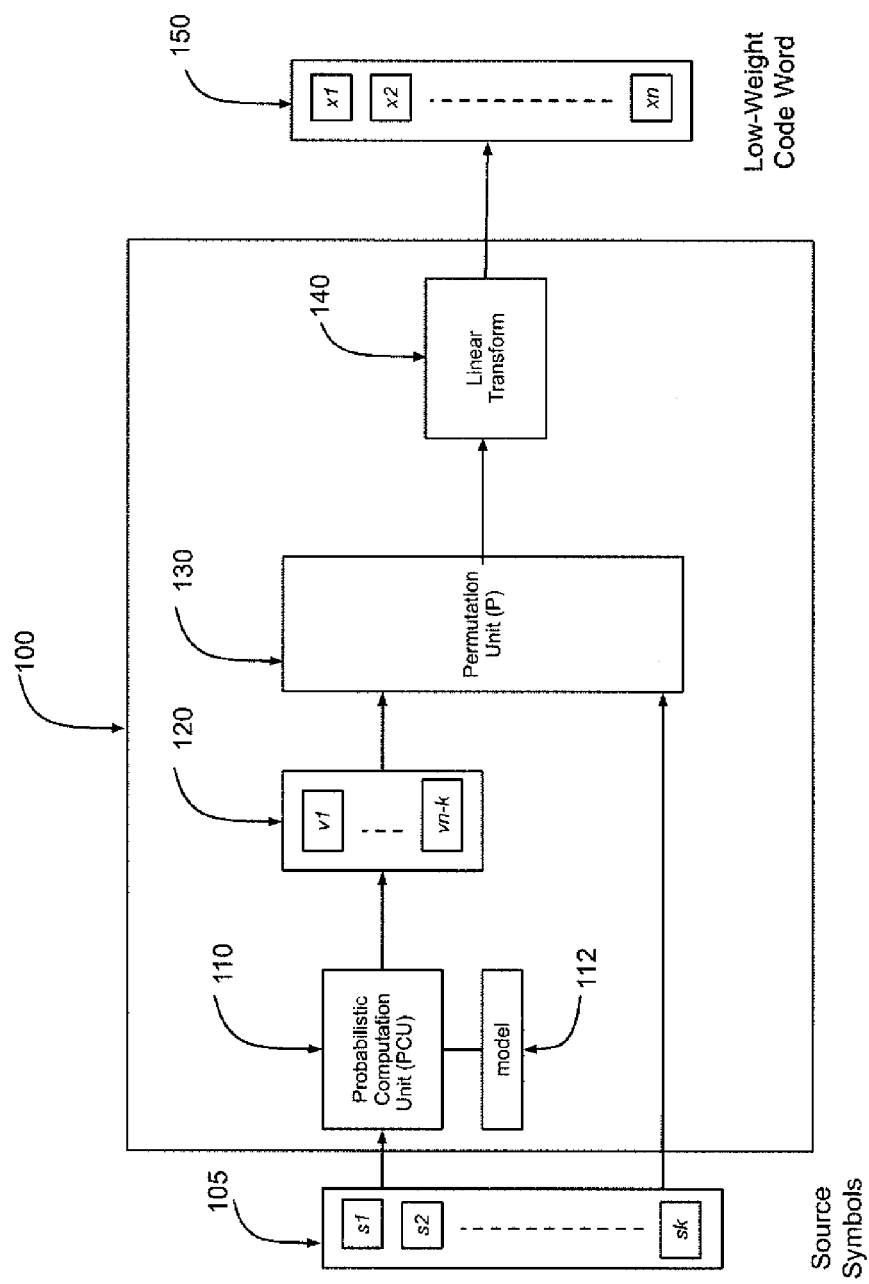
FIG. 1 illustrates an encoder system for low-weight codes.

A first embodiment is described with reference to FIG. 1, presenting encoder circuitry 100 that takes as its input a sequence of k source symbols 105 that are denoted by $s_1, \ldots, s_k$. The output of the encoder circuitry is a set of n bits that forms a low-weight code word 150. A main task of encoder circuitry 100 as exemplified in FIG. 1 is to input a source symbol capacitor of k source symbols $s_1, \ldots, s_k$ into a distinct low-weight code word of which the coordinates are denoted by $x_1, \ldots, x_n$ in such manner that the encoding and decoding can be implemented efficiently. Without loss of generality, it is assumed that these source symbols 105 are bits, although in some cases these source symbols may be taken from another non-binary alphabet. These source bits are input to a probabilistic computation unit (PCU) 110. PCU 110 is configured to compute a set of auxiliary symbols comprising n-k elements (similarly, here assumed to be in the form of bits) that are denoted by $v_1, \ldots, v_{n-k}$. For this purpose, PCU 110 uses a model of the code words to be generated and a representation of this model 112 is stored in electronic storage. Both the source bits $s_1, \ldots, s_k$ and the output bits $v_1, \ldots, v_{n-k}$ as generated by PCU 110 are input to a permutation unit 130. One main task of permutation unit 130 is to construct an intermediate symbol in the form of a single vector of size n out of the k bits $s_1, \ldots, s_k$ and n-k bits $v_1, \ldots, v_{n-k}$. The way this may be done is by creating a single vector out of the bits $s_1, \ldots, s_k$ and bits $v_1, \ldots, v_{n-k}$ and then applying a permutation matrix P. This process is performed by permutation unit 130. The output of permutation unit 130 is input to a transform unit 140, preferably a linear transform unit. Transform unit 140 is defined by a transform matrix T'. By choosing T' and the probabilistic model 112 in the right way, the output of the transform unit 140 is a code word that has a low weight. A typical relation might be x=Tc. In some cases, it might be useful to generate c and construct the x from data bits and auxiliary bits. Then, c is given by T'x, where T' is the inverse of T.

Figure 2:
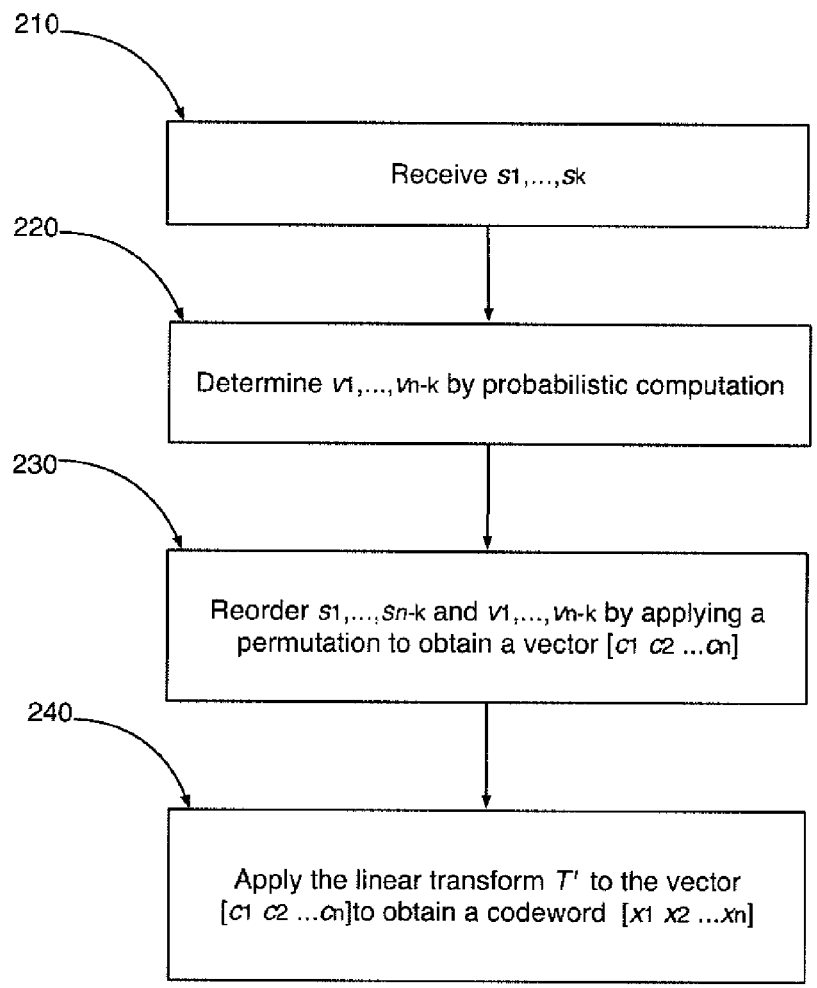
FIG. 2 shows a flow chart for the encoding process.

A flowchart detailing the encoding process is now further described with reference to FIG. 2. The main encoding process can be broken down in four steps. In the first step 210, the input symbols $s_1, \ldots, s_k$ are received. In the second step 220, the auxiliary symbols $v_1, \ldots, v_{n-k}$ are computed. Step 220 may be performed by PCU unit 110 shown in FIG. 1. In the third step 230, the symbols $s_1, \ldots, s_k$ and the auxiliary symbols $v_1, \ldots, v_{n-k}$ are rearranged into a vector $[c_1\ c_2\ \ldots\ c_n]$. In step 240, a linear transform is applied to $[c_1\ c_2\ \ldots\ c_n]$ to obtain a low-weight code word $[x_1\ x_2\ \ldots\ x_n]$.

An embodiment for decoder circuitry is now further described with reference to FIG. 3. The inputs to the decoder circuitry are the bits 305 $x_1, \ldots, x_n$ that constitute a code word from a low-weight code word. Bits 305 and 330 might be stored in electronically readable storage or recovery. A linear transform unit 310 applies a linear transform to bits 305 $x_1, \ldots, x_n$. The result of this transform is input to a selector unit 320 that selects k bits from the results of linear transform unit 310 to recover the original bits 330 $s_1, \ldots, s_k$ as communication.

Linear Transform Units for Low Weight Encoding

The linear transform implemented by linear transform unit 140 may be defined by a matrix T' that is the inverse of a matrix T. Where $s_i$ and $v_i$ are bits, the elements of T' and T are binary as well and arithmetic is performed modulo-2. As one of skill in the art will recognize, one may also use symbols from a different algebraic structure, such as a finite field. In that case, arithmetic is performed according to the rules of that algebraic structure. In a preferred embodiment, the transformation T is chosen as a transformation that is able to polarize a sequence of random variables. Examples of such transforms are described in [Arikan1] in the context of error-correcting codes. A few examples of polarizing transforms of size 2, 4 and 8 are given in Eqn. 1, Eqn. 2 and Eqn. 3.

$$T_2 = \begin{bmatrix} 1 & 1 \\ 0 & 1 \end{bmatrix} \qquad \text{(Eqn. 1)}$$

$$T_4 = \begin{bmatrix} T_2 & T_2 \\ 0 & T_2 \end{bmatrix} = \begin{bmatrix} 1 & 1 & 1 & 1 \\ 0 & 1 & 0 & 1 \\ 0 & 0 & 1 & 1 \\ 0 & 0 & 0 & 1 \end{bmatrix} \qquad \text{(Eqn. 2)}$$

$$T_8 = \begin{bmatrix} T_4 & T_4 \\ 0 & T_4 \end{bmatrix} = \begin{bmatrix} 1 & 1 & 1 & 1 & 1 & 1 & 1 & 1 \\ 0 & 1 & 0 & 1 & 0 & 1 & 0 & 1 \\ 0 & 0 & 1 & 1 & 0 & 0 & 1 & 1 \\ 0 & 0 & 0 & 1 & 0 & 0 & 0 & 1 \\ 0 & 0 & 0 & 0 & 1 & 1 & 1 & 1 \\ 0 & 0 & 0 & 0 & 0 & 1 & 0 & 1 \\ 0 & 0 & 0 & 0 & 0 & 0 & 1 & 1 \\ 0 & 0 & 0 & 0 & 0 & 0 & 0 & 1 \end{bmatrix} \qquad \text{(Eqn. 3)}$$

$$= \qquad \text{(Eqn. 4)}$$

Many types of polarizing matrices are known to those of skill in the art. For instance, Korada1 describes several types of polarizing matrices. Note that the modulo-2 inverses of the matrices shown in Eqn. 1, Eqn. 2 and Eqn. 3 are given by the matrices itself. In this case $T^i = T$.

Probabilistic Computation Unit

Encoders and decoders for low-weight codes disclosed in this application can operate as follows. Consider a set of random variables $X_1, \ldots, X_n$ modeling the coordinates of a low-weight code word. We may choose these variables as independently and identically distributed, where $Pr(X_i=1)=p$. For a low-weight code word, p is substantially smaller than 0.5 and may be chosen as, e.g., 0.1. A transform T can be applied to the random variables $X_1, \ldots, X_n$ to give a set of random variables $C_1, \ldots, C_n$. The transform T can be chosen in such a way that the distribution of each of the $C_i$ given the realization of $C_1, \ldots, C_{i-1}$ is either close to a uniform distribution or close to a distribution that has all of its mass on either 0 or 1. This is called "polarization," which is a concept described in Arikan1 for error correcting codes. To construct a low weight code, the process is reversed. The elements of $C_1, \ldots, C_{i-1}$ for which the distribution of $C_i$ given the realization of $C_i, \ldots, C_{i-1}$ is close to a uniform distribution are associated with the source bits. It is assumed that there are k of such elements of $C_i, \ldots, C_{i-1}$. The remaining n-k positions are associated with auxiliary random variables $V_1, \ldots, V_{n-k}$. Since their distribution has almost all its mass on either 0 or 1, the values of $V_1, \ldots, V_{n-k}$ can be estimated very reliably. This estimation is performed and for each of the $C_1, \ldots, C_n$, a realization is now available. These realizations are denoted by $c_1, \ldots, c_n$. The inverse of the transform T is applied to this vector of realization and the result is a vector $x_1, \ldots, x_n$ that has a low weight.

One task of PCU 110 is to compute the auxiliary bit variables $v_1, \ldots, v_{n-k}$ based on the source bits $s_1, \ldots, s_k$. For this purpose, PCU 110 can use a probabilistic model that describes the statistics of the low-weight code words to be generated. In a preferred embodiment, the probabilistic model used by the PCU models each of the components of $[x_1, \ldots, x_n]$ as a random variable $X_i$ taking values in $[0,1]$ where the probability that $X_i=1$ is equal to a predetermined number p. In preferred embodiments, p is chosen as a number close to zero, to reflect that low-weight words are to be generated. As an example, the value of p may be chosen as 0.1, which corresponds to a code word of which on average one tenth of the components are equal to 1.

Figure 4A:
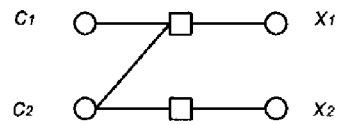
FIG. 4 comprises FIGS. 4A-4C, which illustrate factor graphs for the linear transforms of Equations 1, 2, and 3, respectively.
Figure 4B:
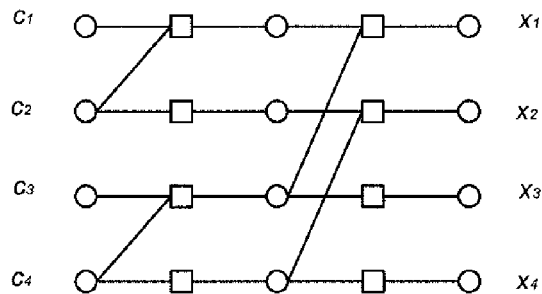
Figure 4C:
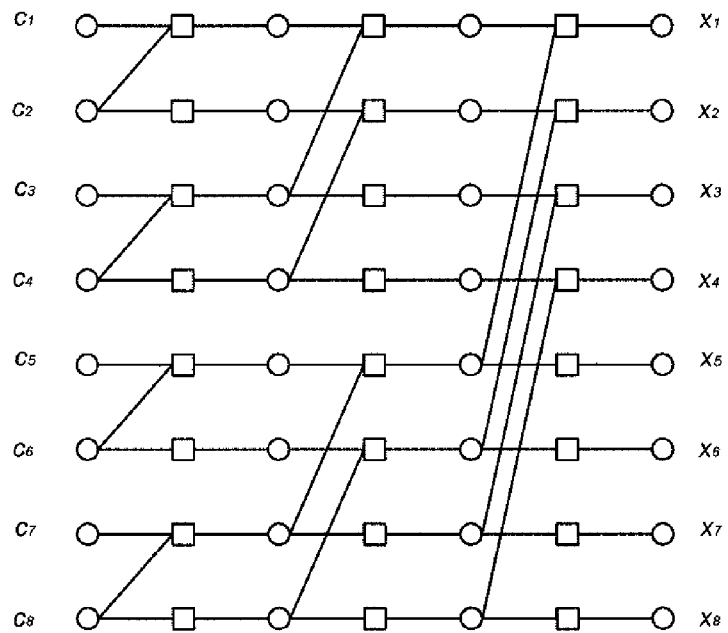

The relation between the symbols of the code words $[x_1, \ldots, x_n]$ and the symbols $[c_1, \ldots, c_n]$ is defined by the linear transform (or the inverse of the linear transform). As known to those of skill in the art, this relation may be depicted by a factor graph. A concise description of factor graphs is given in, e.g., MacKay1. The factor graphs for the transformations as defined by Eqn. 1-3 are depicted in FIGS. 4a, 4b, and 4c, and make use of a recursive construction of the matrices as defined in Eqn. 1, Eqn. 2, and Eqn. 3 respectively Given a set of source bits $s_1, \ldots, s_k$ to be encoded into a low-weight code word, the PCU sets k of the bits $c_1, \ldots, c_n$ to the values of the source bits. In terms of random variables, this means that the realization of the corresponding $c_i$ is fixed. Which values are being set may be determined by an offline procedure such as that disclosed below. The other positions of $c_1, \ldots, c_n$ form the auxiliary random variables $v_1, \ldots, v_{n-k}$.

In the next step, the PCU sequentially computes the most likely value of $v_1, \ldots, v_{n-k}$ given the values of $s_1, \ldots, s_k$ and the probabilistic model. This computation is performed in a sequential fashion. For instance, first the probability that $v_i=1$ is computed, and when this probability is larger than 0.5, it is assumed that $v_1$ is equal to 1. Next, the probability that $v_2=1$ is computed, and when this probability is larger than 0.5, it is assumed that $v_2$ is equal to 1.

Figure 5:
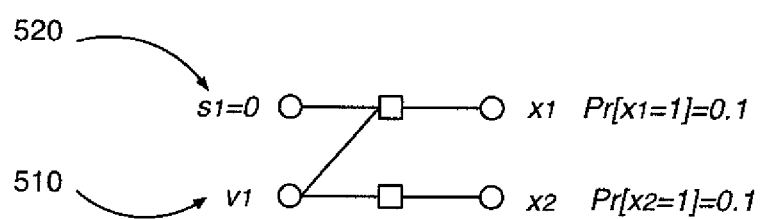
FIG. 5 further describes the factor graph of Equation 1.

As an example, consider the factor graph shown in FIG. 5 for the transformation of Eqn. 1. Here it is assumed that the first variable corresponding to $c_2$ and denoted by 510 in FIG. 5 is the auxiliary variable $v_1$. In this case, only a single source bit $s_1$ is encoded and the first variable $c_1$ is set to this first bit. Now, the task of the PCU 110 is to compute the most likely value for $v_1$ given the value of the source bit and the probability model on $[x_1 \ x_2]$. In FIG. 5 it is assumed that the probability that $x_1$ and $x_2$ are equal to 1 is 0.1. Furthermore, it is assumed that $s_1=0$. The probability $p_1$ that $v_1$ is equal to 1 can be expressed as:

$$p_1 = \frac{Pr[x_1 = 1] \cdot Pr[x_2 = 1]}{Pr[x_1 = 1] \cdot Pr[x_2 = 1] + Pr[x_1 = 0] \cdot Pr[x_2 = 0]} \quad \text{(Eqn. 4)}$$

$$= \frac{0.1 \cdot 0.1}{0.1 \cdot 0.1 + 0.9 \cdot 0.9} = 0.12$$

In this case, the value of the auxiliary variable $v_1$ is set to 0. These computations can be efficiently computed by a message-passing algorithm on the factor graph.

Low-weight Code Generation with N=16

Generation of low weight code words for N=16 is presented as a specific embodiment of the previously described method. Without loss of generality, it is assumed that $2^k$ code words are required, where k=8. Let $s_0, \ldots, s_{k-1}$ denote the k source bits to be encoded into a low weight code work X comprising the components $x_0, \ldots, x_{n-1}$. A set of random variables $X_0 \ldots X_{15}$ is defined that are assumed to be independent and identically distributed binary random values with $Pr[X_i=1]=p=0.05$ (in other words, each bit has a 0.05 probability of having a value of '1'.) With this probabilistic model, the number of 1s in X follows a binomial distribution with mean $16 \times 0.05 = 0.8$. A second sequence of random variables $U_0 \ldots U_{15}$ is generated by application of the matrix of Eqn. 5.

$$T_{16} = \begin{bmatrix} T_8 & T_8 \\ 0 & T_8 \end{bmatrix} = \begin{bmatrix} 1 & 1 & 1 & 1 & 1 & 1 & 1 & 1 & 1 & 1 & 1 & 1 & 1 & 1 & 1 & 1 \\ 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 \\ 0 & 0 & 0 & 1 & 0 & 0 & 0 & 1 & 0 & 0 & 0 & 1 & 0 & 0 & 0 & 1 \\ 0 & 0 & 0 & 0 & 1 & 1 & 1 & 1 & 0 & 0 & 0 & 0 & 1 & 1 & 1 & 1 \\ 0 & 0 & 0 & 0 & 0 & 1 & 0 & 1 & 0 & 0 & 0 & 0 & 0 & 1 & 0 & 1 \\ 0 & 0 & 0 & 0 & 0 & 0 & 1 & 1 & 0 & 0 & 0 & 0 & 0 & 0 & 1 & 1 \\ 0 & 0 & 0 & 0 & 0 & 0 & 0 & 1 & 0 & 0 & 0 & 0 & 0 & 0 & 0 & 1 \\ 0 & 0 & 0 & 0 & 0 & 0 & 0 & 0 & 1 & 1 & 1 & 1 & 1 & 1 & 1 & 1 \\ 0 & 0 & 0 & 0 & 0 & 0 & 0 & 0 & 0 & 1 & 0 & 1 & 0 & 1 & 0 & 1 \\ 0 & 0 & 0 & 0 & 0 & 0 & 0 & 0 & 0 & 0 & 1 & 1 & 0 & 0 & 1 & 1 \\ 0 & 0 & 0 & 0 & 0 & 0 & 0 & 0 & 0 & 0 & 0 & 1 & 0 & 0 & 0 & 1 \\ 0 & 0 & 0 & 0 & 0 & 0 & 0 & 0 & 0 & 0 & 0 & 0 & 1 & 1 & 1 & 1 \\ 0 & 0 & 0 & 0 & 0 & 0 & 0 & 0 & 0 & 0 & 0 & 0 & 0 & 1 & 0 & 1 \\ 0 & 0 & 0 & 0 & 0 & 0 & 0 & 0 & 0 & 0 & 0 & 0 & 0 & 0 & 1 & 1 \\ 0 & 0 & 0 & 0 & 0 & 0 & 0 & 0 & 0 & 0 & 0 & 0 & 0 & 0 & 0 & 1 \end{bmatrix} \quad \text{(Eqn. 5)}$$

Figure 6:
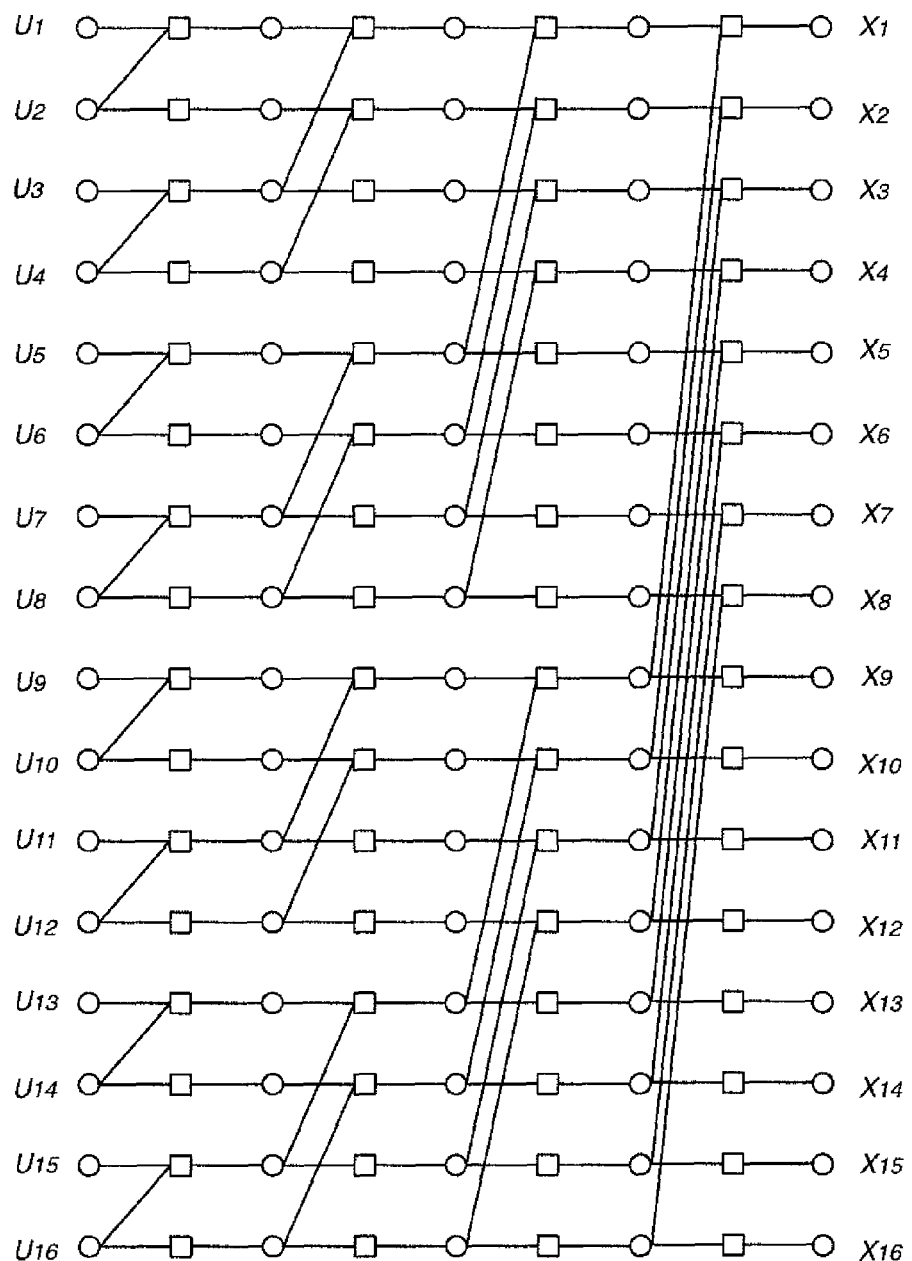
FIG. 6 shows a factor graph for the example of a code where N=16, which may be used in performing the computation of Equation 8.

The relation between these two sequences of random variables is depicted by the factor graph of FIG. 6.

The next step is to compute the entropy $H(U_i|U_1, \ldots, U_{i-1})$ for each $U_1, \ldots, U_{16}$. For each i, this amounts to performing a density evolution operation where the initial density is defined by the probabilistic model $Pr[X_i=1]=0.05$. Table 1 shows the conditional entropies of the resulting densities, and also shows $P_e$, which is the error probability associated with the density. Note that this density evolution process is only used to construct the actual code, and thus only needs to be performed during code construction.

TABLE 1

The results of density evolution for $U_1, \ldots, U_{16}$

| i | $H(Ui | U0, \ldots, Ui-1)$ | Pe |
|---|---|---|
| 1 | 0.97513 | 0.407349 |
| 2 | 0.749006 | 0.284766 |
| 3 | 0.692846 | 0.284766 |
| 4 | 0.23202 | 0.0785324 |
| 5 | 0.648484 | 0.284766 |
| 6 | 0.186088 | 0.068833 |
| 7 | 0.133813 | 0.0494342 |
| 8 | 0.00663544 | 0.00225086 |
| 9 | 0.618027 | 0.284766 |
| 10 | 0.157456 | 0.0639566 |
| 11 | 0.106202 | 0.042468 |
| 12 | 0.00395376 | 0.00144652 |
| 13 | 0.070642 | 0.0283753 |
| 14 | 0.00188375 | 0.000693729 |
| 15 | 0.00102683 | 0.000387081 |
| 16 | 5.01089e-07 | 1.82957e-07 |

Now, a set of indices is defined corresponding to the set of k largest entropies. With the entropies defined in Table 1, the set F is given by Equation 6, which correspond to the k values of i in Table 1 having the largest conditional entropy, and where these indices will correspond to the k source bits $s_1, \ldots, s_k$.

$$F=\{1, 2, 3, 4, 5, 6, 9, 10\} \quad \text{(Eqn. 6)}$$

Encoding is performed by setting the values of $U_F$ to the values of $s_1, \ldots, s_k$ (that is, the bits of U indexed by the value of F corresponding to each of the bits of s) and the values of the remaining $U_F$ are estimated using the probabilistic model of $X_1 \ldots X_{16}$ together with the values of the source bits. Denote the complement of the set F with respect to the integers $1, \ldots, 16$ by $U_F^c$. The value of each of the $U_i$ where I is from $U_F^c$ may be estimated by computing $$Pr(U_i=1|U_1=u_1, \ldots, U_{i-1}=u_{i-1}) \quad \text{(Eqn. 7)}$$

and the value of Ui is estimated as $$\hat{u}_i = \text{round}(Pr(U_i=1|U_1=u_1, \ldots, U_{i-1}=u_{i-1})) \quad \text{(Eqn. 8)}$$

The factor graph of FIG. 6 may be used for the computation of Eqn. 8. The first $U_i$ to be estimated is $U_7$ and the computation in the factor graph is illustrated in FIG. 7.

Figure 7:
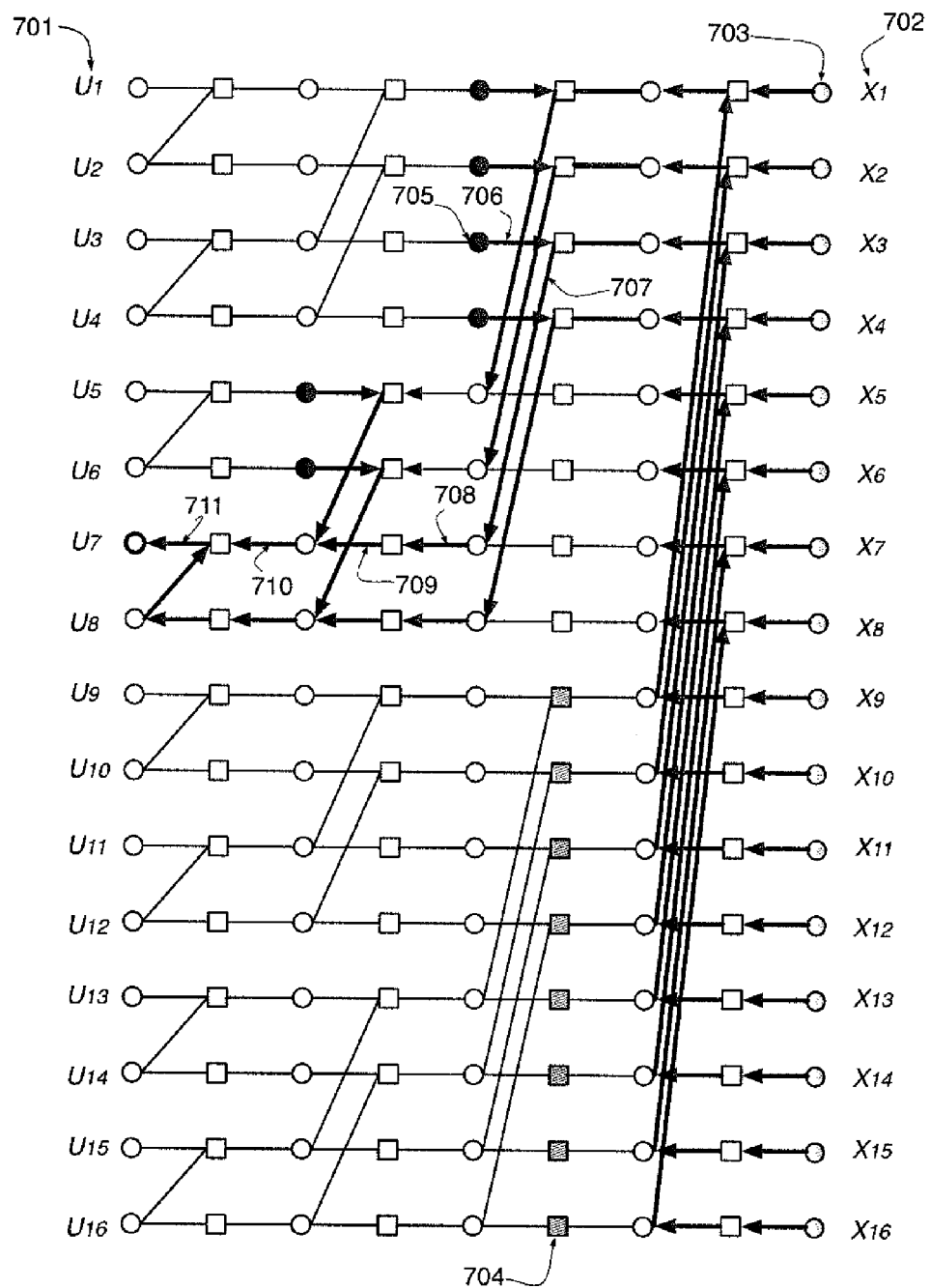
FIG. 7 further describes the method of computation using the factor graph.

In FIG. 7, the light gray variable nodes (circle 703, as one example,) corresponding to $X_1 \ldots X_{16}$ (identified as 702 etc.) are initialized according to their probabilistic model. The outputs of the gray check nodes (square 704 shown as one example) correspond to log-likelihood ratios of 0 since the prior distribution on $U_9 \ldots U_{16}$ is uniform. Since $U_1 \ldots U_6$ are known (having been set to $(s_1, \ldots, s_6)$, the black variable nodes are known also. To compute $Pr(U_7)$ a message pass (one portion of which is identified as the sequence 705 through 711) is performed on the highlighted tree toward the node $U_7$ and the estimate for $U_7$ is generated as $$\hat{U}_7 = \text{round}(Pr(U_i=1|U_0=u_0, \ldots, U_{i-1}=u_{i-1})) \quad \text{(Eqn. 9)}$$

For the computation of $P(U_i|U_0, \ldots, U_{i-1})$ the factor graph of FIG. 6 may be used. Some of the encodings are illustrated in Table 2. All generated code words are of low weight, having an average weight of 2.75 and a maximum weight of 4. The weight distribution is shown in Table 3.

TABLE 2

Low-weight code words for several input sequences

| s0 ... s7 | x0 ... x15 |
|---|---|
| 00000000 | 0000000000000000 |
| 11001000 | 0100000000100010 |
| 01100100 | 0000011000000000 |
| 11101100 | 0000010000001010 |
| 11101010 | 1100000000000010 |
| 10011110 | 0100000100100000 |
| 11101101 | 0000100000000110 |
| 01100111 | 0000001000000100 |
| 10111111 | 1100000000000001 |

TABLE 3

The weight distribution of the low-weight code for n = 16

| Weight | # |
|---|---|
| 0 | 1 |
| 1 | 16 |
| 2 | 78 |
| 3 | 112 |
| 4 | 49 |
| 5 ... 16 | 0 |

Figure 3:
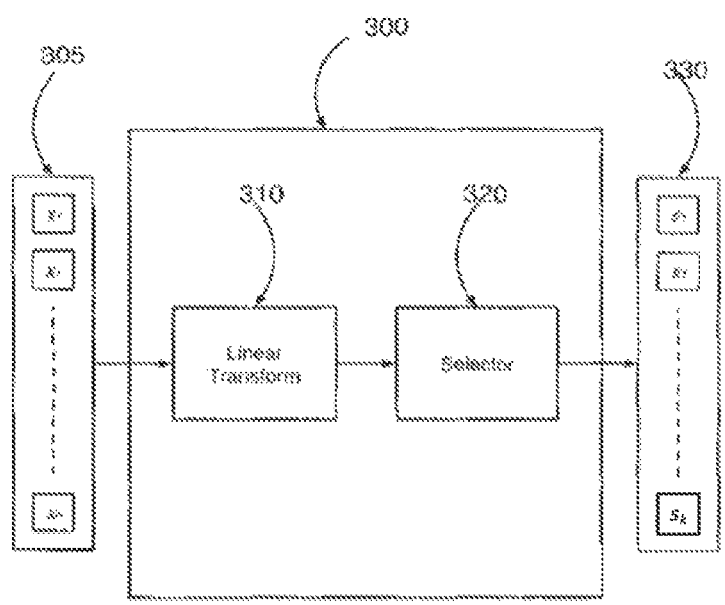
FIG. 3 shows a preferred embodiment of a decoder.

Decoding a low weight code word to the original bits is extremely simple, as shown in FIG. 3. The low-weight code word 300 is transformed 310 by a multiplication by $T_{16}$ as presented in Eqn. 5. The original bits 330 may then be read from the transformed result by selecting them 320 from the locations indexed by vector F, which correspond to the k highest entropy values identified during code creation. This operation is requires about 64 exclusive-or operations in total.

Compared to an equivalent link transmitting the original source bits without low weight coding, the power consumption of a chip-to-chip link utilizing this code may be reduced by a factor of 1.5.

Low-weight Code Generation with N=32

Figure 8:
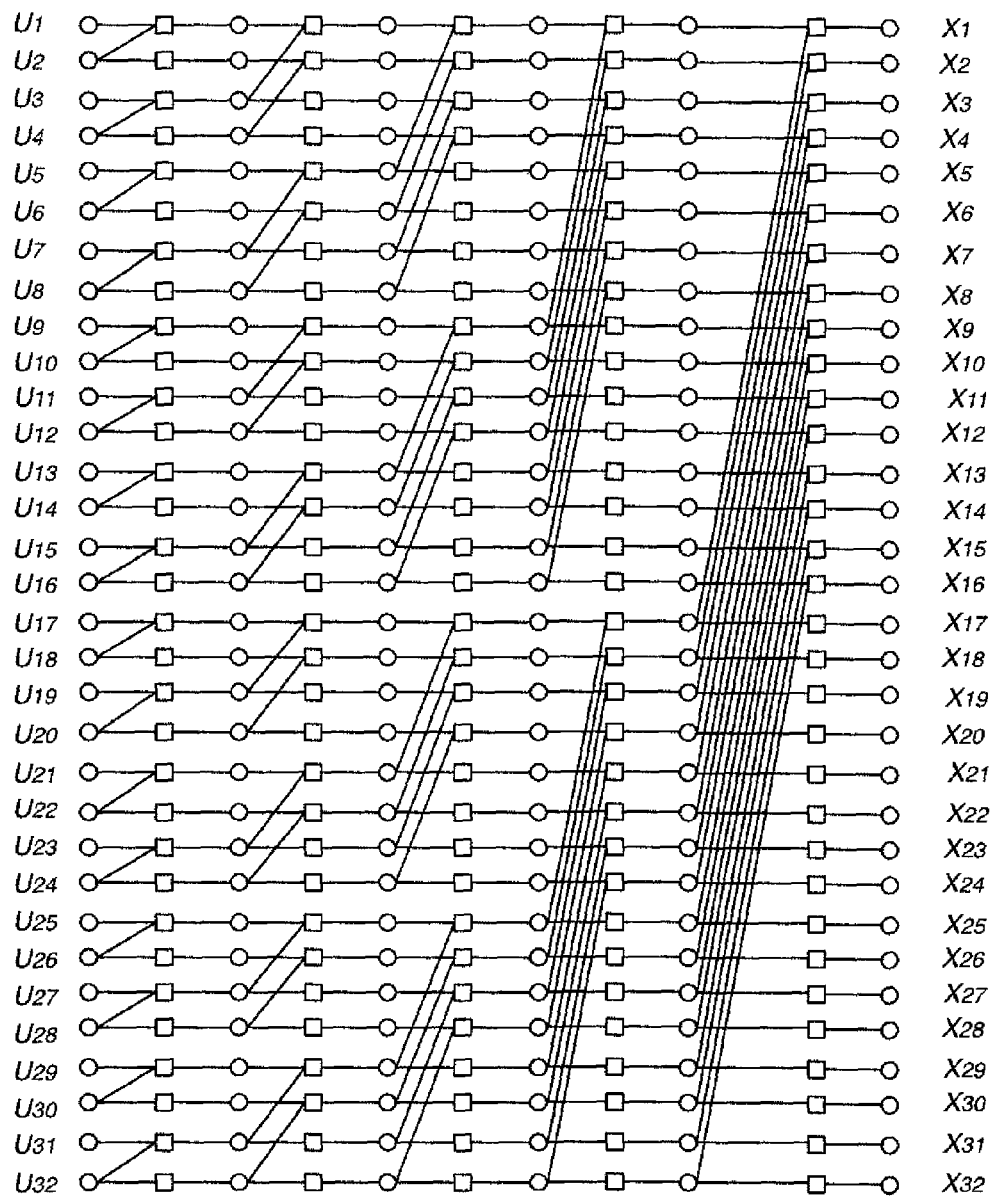
FIG. 8 shows a factor graph for the example of a code where N=32.

Another example of a preferred embodiment may be used to generate low-weight code words for n=32. Without loss of generality, we assume that $2^k$ code words are required, where k=16. Let $s_1, \ldots, s_{16}$ denote the 16 source bits to be encoded into a low-weight code word x of which the components are denoted by $x_1, \ldots, x_n$. We define a set of random variables $X_1, \ldots, X_{32}$ where we assume that these random variables are independent and identically distributed, with $Pr[Xi=0]=0.95$. With this probabilistic model, the number of 1s in $X_1, \ldots, X_{32}$ would follow a binomial distribution with mean $32 \times 0.05=1.6$. A second sequence of random variables $U_1, \ldots, U_{32}$ is generated by application of the matrix G⊗ 5. In a similar way as for the previous example of a code word length of 16, we can generate a factor graph as shown in FIG. 8. The next step is to compute the entropy's $H(Ui|U_1, \ldots, U_{i-1})$ for $U_1, \ldots, U_{31}$. For each i this amounts to performing a density evolution operation where the initial density is defined by the probabilistic model $(Pr[Xi=0]=0.95)$. Table 4 shows the conditional entropies of the resulting densities. With these entropy values, the set F is chosen as in Equation 10, which correspond to the k values of i in Table 4 having the largest conditional entropy, and where these indices will correspond to the k source bits $s_1, \ldots, s_k$.

$$F=\{1,2,3,4,5,6,7,9,10,11,13,17,18,19,21,25\} \quad \text{(Eqn. 10)}$$

Encoding is performed by setting the values of $U_F$ to the values of $s_1, \ldots, s_{16}$ and the values of the remaining $U_F^c$ are estimated. For this estimation, the probabilistic model of $X_1, \ldots, X_n$ is used together with the values of the source bits. The value of each of the $U_i$ from $U_F^c$ can be estimated by computing $U_i$ we compute $\Pr(U_i=1|U_1=u_0, \ldots, U_{i-1} \le u_{i-1})$, and the value of $U_i$ is estimated as $\hat{u}_i=\text{round}(\Pr(U_i=1|U_1,=u_0, \ldots, U_{i-1}=u_{i-1}))$.

TABLE 5

Low-weight code words for several input sequences

| s0...s15 | x0...x31 |
|---|---|
| 0010000010111000 | 10001001000000000000100000100001 |
| 0000100010111000 | 00000100000000000000100010000100 |
| 1011111110111000 | 10000000000000010001000001010000 |
| 0110111100100100 | 00000100000010000000010100000000 |
| 1011100010100100 | 00010000000110000000000001010000 |
| 0101001010100100 | 00000000011000000100010001000001 |
| 1110111101100100 | 00001100000010000000000000001010 |
| 0101110011100100 | 00000000010000010000101000000000 |
| 1111101011110110 | 00000000001100001000000010000010 |

For the computation of $P(U_i|U_1, \ldots, U_{i-1})$ the factor graph of FIG. 8 can be used. A few encodings are given in Table 5. All generated words are of low-weight and the weight distribution is given in Table 6. The average weight of a word is 4.84 and the maximum weight is 6.

TABLE 6

The weight distribution of the low-weight code for n = 32

| Weight | # |
|---|---|
| 0 | 1 |
| 1 | 32 |
| 2 | 496 |
| 3 | 4960 |
| 4 | 15655 |
| 5 | 27776 |
| 6 | 16616 |

Decoding the low-weight code word to the original bits is simple. Decoding is accomplished by multiplying the low-weight code word with $G_2 \otimes 5$ and then selecting from the result the original bits, which may be found at the bit locations identified by the values of vector F, which correspond to the k highest entropy values found during code creation. The decoding operation requires approximately 160 operations in total. This scales as N log 2(N). So in this case 32*log 2(32)= 160 or 5 operations per code word bit.

Compared to an equivalent link transmitting the original source bits without low weight coding, the power consumption of a chip-to-chip link utilizing this code may be reduced by a factor of 1.7.

Applications of Low-weight Codes

Some communication scenarios permit wide buses to be used. One example is on-chip communications, where the number of wires is often not a limiting factor. Another example is package-on-package chip-to-chip buses where a large number of balls, through-vias, or bonding wires can be used to connect the two chips. Such systems may not have strong constraints on the total number of wires in the interconnect, but may still have constraints on power utilization or on simultaneous switching noise or crosstalk. The techniques presented herein can provide a way to mitigate these power and noise issues.

Such wide buses are also used in CPU-memory communications, such as a recent DRAM interface design where a single DRAM is fed with 128 wires. With the techniques presented herein, it may be beneficial to use a large number of wires carrying low-weight words.

Storage Applications of Low-weight Codes

Some storage devices can have different power, latency, and addressability characteristics when storing a '1' bit versus a '0' bit. For example, some Flash EEPROM devices permit individual 0 bits to be written directly, but 1 bits may be written only by block-erasing a large range of words. For such systems, storage constraints may be relaxed by storing only low-weight code words having a preponderance of a preferred bit value.

Wireless Low Power Communications

In one embodiment, low-weight code words are used as a form of low-weight pulse position modulation for low-power wireless communications. The consecutive positions of a low-weight code word are transmitted in consecutive time intervals. Typically, power consumption of the final transmitter output stage is directly related to the weight of the transmitted code word, enabling substantial power savings.

In a further embodiment, the RF communications channel uses ultra-wide band transmission, where each '1' value in a low weight code word is transmitted as a pulse with a width of about 1 ns or smaller. As an example, a code word length of 64 would thus produce a symbol length of about 64 ns or less. Information is spread across a wide range of spectrum and very low power operation may be achieved. Similar techniques can be applied in wireless sensor networks.

Ternary Codes and Codes on Higher Alphabets

The methods described herein can easily be extended to ternary codes, allowing for higher pin-efficiency, while maintaining low power consumption and good crosstalk properties. The extension to even higher-order alphabets is also possible, as is extension to generalized transforms.

Suboptimal Message-passing Algorithms

For encoding, a message passing algorithm has been described that operates on a tree structure. That is, as previously described all variable nodes and check nodes have degree 2. One may use suboptimal rules at the variable nodes and check nodes to make hardware implementation easier. As one example, a min operator may be used for the update rule at the check nodes.

Additional Power Savings by Transmitting Symbol Differences

One embodiment provides additional power savings by transmitting differences between the present and previous code words. Let $x_1$ denote the first word that is to be transmitted on the bus, which is encoded into a low-weight code word $c_1$. This code word is transmitted on the bus and the word $c_1$ is stored temporarily at the transmitter and receiver. Let $x_2$ denote the second word that is to be transmitted on the bus, which is encoded into $c_2$ and the positions of the stored value $c_1$ corresponding to the ones in $c_2$ are flipped, leading to a word $c_2'$. (That is, $c_2'$ is the exclusive-or of $c_1$ and $c_2$.) The word $c_2'$ is transmitted, and the original value $c_2$ is stored. At the receiver, the difference between $c_2'$ and the stored value of $c_1$ is determined, (again, preferably by exclusive-or'ing the received word and the stored word,) recovering the value $c_2$ which is stored at the receiver for subsequent use, and is used to recover the second sequence of source bits $x_2$ by decoding.

The initial values stored in both transmitter and receiver should be initialized prior to communication, preferably to the common value of zero.

Combination with Crosstalk Cancellation Techniques

The fact that the words on the bus are of low weight can have additional advantages. Since there are only few '1' values, generally equating to few signal lines being driven and/or fewer signal line transitions, the effects of crosstalk may be cancelled much easier than conventional bus communication systems. Each of the drivers that drives a "1" can take its neighbors into account also. Worse case crosstalk limits the speed in a bus communication system where the wires are modeled as capacitive loads and simple inverters are used to drive the wires. With these techniques, the speed may be increased substantially.

Hardware Implementation

Once the probabilistic computation has been performed to create a particular low density code, it is possible to perform encoding operations using that code using only a look-up table pre-computed from the factor graph of the code. For example, a 16 bit low-weight code requires a look-up table containing 2^16 entries, where each entry comprises 32 bits. However, a simple encoding look-up table of this type becomes infeasible for larger codes, growing to require 2^32 entries of 64 bits each for the case of a 32 bit code. Even in such cases hybrid encoding methods may be tractable, pre-computing look-up tables to replace the more computationally complex portions of the factor graph, and relying on factor graph traversal for the remainder of the encoding. It is also possible to intentionally find suboptimal encodings during the code generation process, with the intent of producing factor graphs containing less computationally complex structures that, as an example, are more easily implemented as hardware circuits.

What is claimed is:

1. A method for transferring information, the method comprising:
    deriving auxiliary symbols $V=(v_0, v_1, \ldots, v_{p-1})$, comprising p elements, in dependence of both a predetermined encoding model and information symbols $S=(s_0, s_1, \ldots, s_{k-1})$, comprising k elements;
    encoding code symbols $X=(x_0, x_1, \ldots, x_{n-1})$, comprising n elements, wherein n>k, in dependence of both the information symbols S and the auxiliary symbols V in accordance with a predetermined encoding algorithm such that the code symbols X are in conformity with the predetermined encoding model;
    transmitting the code symbols X and;
    decoding the transmitted code symbols X into the original information symbols S.

2. The method of claim 1, wherein deriving the auxiliary symbols V comprises using a probabilistic computation in conjunction with an encoding model determined by a predetermined constraint, wherein the code symbols X are low weight codes having less than k bits with a predetermined logic value.

3. The method of claim 2, wherein encoding the code symbols X comprises:
    composing intermediate symbols $U=(u_0, u_1, \ldots, u_{n-1})$ using elements $s_i$ of the information symbols S and elements $v_j$ of the auxiliary symbols V, wherein p=n-k; and
    employing a linear transformation to convert the intermediate symbols U into the code symbols X.

4. The method of claim 3, wherein decoding the transmitted code symbols X into the original information symbols S comprises employing a linear transformation which is inverse to the linear transformation used in the encoding step.

5. The method of claim 3, wherein the linear transformation is a polarizing linear transformation.

6. The method of claim 5, wherein the relation between the intermediate symbols U and the code symbols X is given by $X=T^{-1} \cdot U$, wherein T is the m-fold kronecker product of $$G_2^{\otimes m} = \begin{bmatrix} 1 & 1 \\ 0 & 1 \end{bmatrix}^{\otimes m}, \text{ wherein } 2^m = n.$$

7. The method of claim 6, wherein the elements $s_j$ of the vector S correspond with the elements $u_i$ of the vector U for which the entropies $H(u_i|u_0, \ldots, u_{i-1})$ are closest to 1, and the other elements $u_j$ of the vector U are equal to round $(Pr(u_i=1|u_0, \ldots, u_{i-1}))$.

8. A method for encoding information, the method comprising:
    determining an encoding model by referencing a predetermined constraint, wherein the form of the encoding model is dependent on the value of the predetermined constraint;
    using a probabilistic computation in conjunction with the encoding model and information symbols $S=(s_0, s_1, \ldots, s_{k-1})$, comprising k elements to derive auxiliary symbols $V=(v_0, v_1, \ldots, v_{p-1})$, comprising p elements; and
    generating code symbols $X=(x_0, x_1, \ldots, x_{n-1})$, comprising n elements, wherein n>k, in dependence of both the information symbols S and the auxiliary symbols V in accordance with a predetermined encoding algorithm such that the generated code symbols X are in conformity with the encoding model;
    the code symbols X being output from the method.

9. The encoding method of claim 8, wherein the code symbols X are low weight codes having less than k bits with a predetermined logic value.

10. The encoding method of claim 8, wherein generating the code symbols X comprises:
    composing intermediate symbols $U=(u_0, u_1, \ldots, u_{n_-})$ using elements $s_i$ of the information symbols S and elements $v_j$ of the auxiliary symbols V, wherein p=n-k; and
    employing a linear transformation to convert the intermediate symbols U into the code symbols X.

11. The encoding method of claim 10, wherein the linear transformation is a polarizing linear transformation.

12. The encoding method of claim 11, wherein the relation between the intermediate symbols U and the code symbols X is given by $X=T^{-1} \cdot U$, wherein T is the m-fold kronecker product of $$G_2^{\otimes m} = \begin{bmatrix} 1 & 1 \\ 0 & 1 \end{bmatrix}^{\otimes m}, \text{ wherein } 2^m = n.$$

13. The encoding method of claim 12, wherein the elements $s_j$ of the vector S correspond with the elements $u_i$ of the vector U for which the entropies $H(u_1|u_0, \ldots, u_{i-1})$ are closest to 1, and the other elements $u_j$ of the vector U are equal to round $(Pr(u_i=1|u_0, \ldots, u_{i-1}))$.

14. A method for decoding information, the method comprising:
    deriving a set of elements $U=(u_0, u_1, \ldots, u_{n-1})$, comprising n elements, from code symbols $X=(x_0, x_1, \ldots, x_{n-1})$, comprising n elements, by employing a polarizing linear transformation based on a matrix T, which is the m-fold kronecker product of $$G_2^{\otimes m} = \begin{bmatrix} 1 & 1 \\ 0 & 1 \end{bmatrix}^{\otimes m} \text{ where } 2^m = n;$$

and generating information symbols $S=(s_0, s_1, \ldots, s_{k-1})$, comprising k elements, wherein n>k, by selecting a predetermined subset of the set of elements U;

the information symbols S being output from the method.

15. The decoding method of claim 14, wherein selecting the predetermined subset of the set of elements U comprises selecting elements $u_i$ who's entropies $H(u_i|u_0, \ldots, u_{i-1})$ are closest to 1.

16. An encoder circuit for transferring information symbols comprising k elements into code symbols comprising n elements, wherein the encoder circuit comprises a probabilistic computation unit configured to derive an auxiliary symbol comprising p elements from the information symbols based on an encoding model determined by a predetermined constraint, a permutation unit for combining elements of the information symbols and elements of the probabilistic computation unit into an intermediate symbol, and a transform unit for transforming the intermediate symbols into the code symbols by a polarizing linear transformation of the intermediate symbols.

17. A decoding circuit for transforming code symbols comprising n elements into information symbols comprising k elements, wherein the decoding circuit is configured to perform a polarizing linear transformation in which the elements of the information symbols correspond with a predetermined subset of elements derived by the polarizing linear transformation of the code symbols, wherein the polarizing linear transformation is based on a matrix T, which is the m-fold kronecker product of $$G_2^{\otimes m} = \begin{bmatrix} 1 & 1 \\ 0 & 1 \end{bmatrix}^{\otimes m} \text{ where } 2^m = n.$$

* * * * *

UNITED STATES PATENT AND TRADEMARK OFFICE
CERTIFICATE OF CORRECTION

PATENT NO. : 8,952,834 B1  
APPLICATION NO. : 13/778045  
DATED : February 10, 2015  
INVENTOR(S) : Harm Cronie Page 1 of 1

It is certified that error appears in the above-identified patent and that said Letters Patent is hereby corrected as shown below:

In the Claims

Please correct as follows:

Col. 13, Claim 15, line 17, replace "who's" with -- whose --.

Signed and Sealed this
Fourteenth Day of July, 2015

Michelle K. Lee
*Director of the United States Patent and Trademark Office*